(12) United States Patent
Jang et al.

(10) Patent No.: US 7,317,745 B2
(45) Date of Patent: Jan. 8, 2008

(54) MULTI-WAVELENGTH LASER DIODE

(75) Inventors: Tae Sung Jang, Suwon (KR); Hee Seok Choi, Seoul (KR); Sang Deog Cho, Suwon (KR); Dong Min Jeon, Suwon (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 435 days.

(21) Appl. No.: 10/998,921

(22) Filed: Nov. 30, 2004

(65) Prior Publication Data

US 2006/0056467 A1    Mar. 16, 2006

(30) Foreign Application Priority Data

Sep. 14, 2004 (KR) .................. 10-2004-0073341

(51) Int. Cl.
*H01S 5/00* (2006.01)
*H01S 3/08* (2006.01)

(52) U.S. Cl. .............. 372/49.01; 372/50.1; 372/99

(58) Field of Classification Search ............. 372/49.01, 372/99, 50.121
See application file for complete search history.

(56) References Cited

FOREIGN PATENT DOCUMENTS

| JP | 60-214578 A | 10/1985 |
|---|---|---|
| JP | 05-102597 | 4/1993 |
| JP | 07-249829 | 9/1995 |
| JP | 2001-223428 | 8/2001 |
| JP | 2002-223030 | 9/2002 |
| JP | 2003-124563 A | 4/2003 |
| JP | 2004-153271 | 5/2004 |

OTHER PUBLICATIONS

Chinese Intellectual Property Office, Office Action mailed Apr. 13, 2007 and English Translation.
English Translation of Japanese Patent Office, Office Action mailed Dec. 12, 2006.
Japanese Patent Office, Office Action mailed Jul. 25, 2006 and English Translation.

*Primary Examiner*—Armando Rodriguez
(74) *Attorney, Agent, or Firm*—Lowe Hauptman Ham & Berner

(57) ABSTRACT

The present invention relates to a multi-wavelength laser diode, in which an oscillating structure includes a semiconductor substrate, and a lower cladding layer, an active layer and a ridge formed in their order on the semiconductor substrate. A first metal layer is formed on a first face of the oscillating structure including one end of the ridge, and made of a metal having a high reflectivity in a first wavelength range of at least a predetermined wavelength. A second metal layer is formed on the first metal layer, the second metal layer being made of a metal having a high reflectivity in a second wavelength range under the predetermined wavelength. The multi-wavelength laser diode can improve the reflective layer structure to achieve a high reflectivity in the entire visible light range.

22 Claims, 12 Drawing Sheets

MULTI-WAVELENGTH LASER DIODE

RELATED APPLICATION

The present application is based on, and claims priority from, Korean Application Number 2004-73341, filed Sep. 14, 2004, the disclosure of which is hereby incorporated by reference herein in its entirety.

BACKGROUND OF THE INVENTION

1. Field of the Invention

The present invention relates to a multi-wavelength laser diode, more particularly, which can improve a reflective layer structure in order to achieve a high reflectivity in the entire visible light range.

2. Description of the Related Art

Laser diodes are used as an optical pickup for various storages in order to produce light in response to application of electric current.

A laser diode needs a high reflectivity mirror or reflective face on one end of an oscillating layer in order to realize high power laser beams, in which producing such a reflective face requires coating a high reflectivity thin film. Various studies have been made so far in order to produce such a high reflective thin film.

FIG. 1 is a perspective view of a conventional laser diode, FIG. 2 is a cross-sectional view taken along the line II-II in FIG. 1, and FIG. 3 is another cross-sectional view taken along the line III-III in FIG. 1.

Referring to FIGS. 1 to 3, a laser diode 10 includes an oscillating structure 12 for generating light, p- and n-metal layers 26 and 28 coated on the top and underside of the oscillating structure 12, respectively, a reflective layer 30 of a high reflectivity formed on one end of the oscillating structure 12 and an anti-reflective layer 40 formed on the other end of the oscillating structure 12 opposite to the reflective layer 30.

The oscillating structure 12 includes a lower cladding layer 16, an active layer 18, an upper cladding layer 20 and an upper capping layer 24 formed in their order on a semiconductor substrate 14. The upper cladding layer 20 has a ridge 20a formed in a central upper portion thereof so that inactive regions 22 such as current blocking layers are formed at both sides of the ridge 22a.

When a forward voltage is applied to the p- and n-metal layers 26 and 28 of the laser diode 10 having the above oscillating structure 12, electrons and holes are introduced along vertical routes into the active layer 18 where the electrons and holes are combined to emit a laser beam, i.e., photons corresponding to the energy band gap of the active layer 18.

The reflective layer 30 is formed on one face of the oscillating structure 12 adjacent to one end of the ridge 22a and the anti-reflective layer 40 is formed on another face of the oscillating structure opposite to the reflective layer 30 so that a cavity resonator formed between the reflective and anti-reflective layers 30 and 40 can generate laser oscillation.

The reflective layer 30 is made of dielectric material, and includes at least 7 pairs of $Al_2O_3$ and $Si_3N_4$ layers which are deposited one atop another to raise reflectivity.

However, a process for forming the reflective layer 30 of multilayer dielectric material spends a long time period while producing poor reliability. Although the multilayer dielectric layer can achieve excellent reflectivity with respect to a single wavelength, there is a critical drawback in that it cannot achieve a uniform reflectivity with respect to a multi-wavelength band.

That is, the thickness of each dielectric layer is determined by $\lambda/4n$, in which $\lambda$ is the wavelength of a laser beam to be reflected, which is emitted from an oscillating layer including the active layer 18 and the upper and lower cladding layers 16 and 20, and n is the reflectivity of corresponding dielectric material.

Reflectivity examples of conventional dielectric reflective layers with respect to wavelengths are shown in FIGS. 4 and 5, in which FIG. 4 illustrates a reflectivity curve of a dielectric reflective layer with respect to wavelengths where a corresponding laser beam has a wavelength of 715 nm, and FIG. 5 illustrates a reflectivity curve of a dielectric reflective layer with respect to wavelengths where a corresponding laser beam has a wavelength of 780 nm.

The graph shown in FIG. 4 has the highest reflectivity of about 92% at 715 nm. However, it is seen that the reflectivity significantly drops at a wavelength range of 650 nm or less. The graph shown in FIG. 5 also has the highest reflectivity of about 92%. It can be observed, however, that the reflectivity also significantly drops at a wavelength range of 700 nm or less.

Accordingly, such a reflective layer based upon dielectric material can have a high reflectivity only in a specific wavelength range, but cannot maintain the high reflectivity in a wide wavelength range.

SUMMARY OF THE INVENTION

The present invention has been made to solve the foregoing problems of the prior art and it is therefore an object of the present invention to provide a multi-wavelength laser diode having at least one metal reflective layer in order to simplify a fabrication process thereof as well as enhance productivity.

It is another object of the present invention to provide a multi-wavelength laser diode having at least one metal reflective layer in order to achieve a high reflectivity uniformly in a multi-wavelength range.

According to an aspect of the invention for realizing the object, there is provided a multi-wavelength laser diode comprising: an oscillating structure including a semiconductor substrate, and a lower cladding layer, an active layer and a ridge formed in their order on the semiconductor substrate; a first metal layer formed on a first face of the oscillating structure including one end of the ridge, the first metal layer being made of a metal having a high reflectivity in a first wavelength range of at least a predetermined wavelength; and a second metal layer formed on the first metal layer, the second metal layer being made of a metal having a high reflectivity in a second wavelength range under the predetermined wavelength.

The multi-wavelength laser diode of the invention may further comprise a dielectric layer interposed between the first metal layer and the first face of the oscillating structure.

Preferably, the first metal layer is made of at least one selected from the group consisting of Ag, Au, Cu, Pd and Pt.

Preferably, the second metal layer is made of Al.

The multi-wavelength laser diode of the invention may further comprise a high reflectivity intermediate metal layer interposed between the first and second metal layers.

In this case, the intermediate metal layer is preferably formed via sputtering or electron beam deposition.

Preferably, the first metal layer is made of Au or Cu, the intermediate metal layer is made of Ag, and the second metal layer is made of Al.

The multi-wavelength laser diode of the invention may further comprise at least a pair of high and low reflectivity dielectric layers formed on the second metal layer.

Preferably, the first and second metal layers are formed via sputtering or electron beam deposition.

According to another aspect of the invention for realizing the object, there is provided a multi-wavelength laser diode comprising: an oscillating structure including a semiconductor substrate, and a lower cladding layer, an active layer and a ridge formed in their order on the semiconductor substrate; and a high reflectivity metal layer formed on a first face of the oscillating structure including one longitudinal end of the ridge, and made of a mixture of at least two high reflectivity metals, whereby a first one of the metals having a high reflectivity in a high wavelength range of at least a predetermined wavelength is rich in a first region of the high reflectivity metal layer thereby to form a high-wavelength reflective region therein, and a second one of the metals having a high reflectivity in a low wavelength range under the predetermined wavelength is rich in a second region of the high reflectivity metal layer thereby to form a low-wavelength reflective region therein.

Preferably, the first metal is at least one selected from the group consisting of Ag, Au, Cu, Pd and Pt, and the second metal is Al.

The multi-wavelength laser diode of the invention may further comprise a dielectric layer interposed between the high reflectivity metal layer and the first face of the oscillating structure.

The multi-wavelength laser diode of the invention may further comprise at least a pair of high and low reflectivity dielectric layers formed on the high reflectivity metal layer.

Preferably, the high reflectivity metal layer is formed via co-sputtering or simultaneous electron beam deposition of the first and second metals.

According to yet another aspect of the invention for realizing the object, there is provided a multi-wavelength laser diode comprising: an oscillating structure including a semiconductor substrate, and a lower cladding layer, an active layer and a ridge formed in their order on the semiconductor substrate; and a first metal layer formed on a first face of the oscillating structure including one longitudinal end of the ridge, and made of a mixture of at least two high reflectivity metals, whereby a first one of the metals having a high reflectivity in a high wavelength range of at least a first wavelength is rich in a first region of the high reflectivity metal layer thereby to form a high-wavelength reflective region therein, and a second one of the metals having a high reflectivity in an wavelength range between the first wavelength and a second wavelength under the first wavelength is rich in a second region of the high reflectivity metal layer thereby to form an intermediate-wavelength reflective region therein; and a second metal layer formed on the first metal layer, and made of a metal having a high reflectivity in a low wavelength range under the second wavelength.

Preferably, the first metal is at least one selected from the group consisting of Au, Cu, Pd and Pt, and the second metal is Ag, and the third metal is made of Al.

The multi-wavelength laser diode of the invention may further comprise a dielectric layer interposed between the first metal layer and the first face of the oscillating structure.

The multi-wavelength laser diode of the invention may further comprise at least a pair of high and low reflectivity dielectric layers formed on the second metal layer.

Preferably, the first metal layer is formed via co-sputtering or simultaneous electron beam deposition of the first and second-metals.

Any of the afore-described multi-wavelength laser diodes of the invention may further comprise an anti-reflective layer formed on a second face of the oscillating structure opposite to the first face thereof.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Preferred embodiments of the present invention will now be described in detail with reference to the accompanying drawings.

Figure 3:
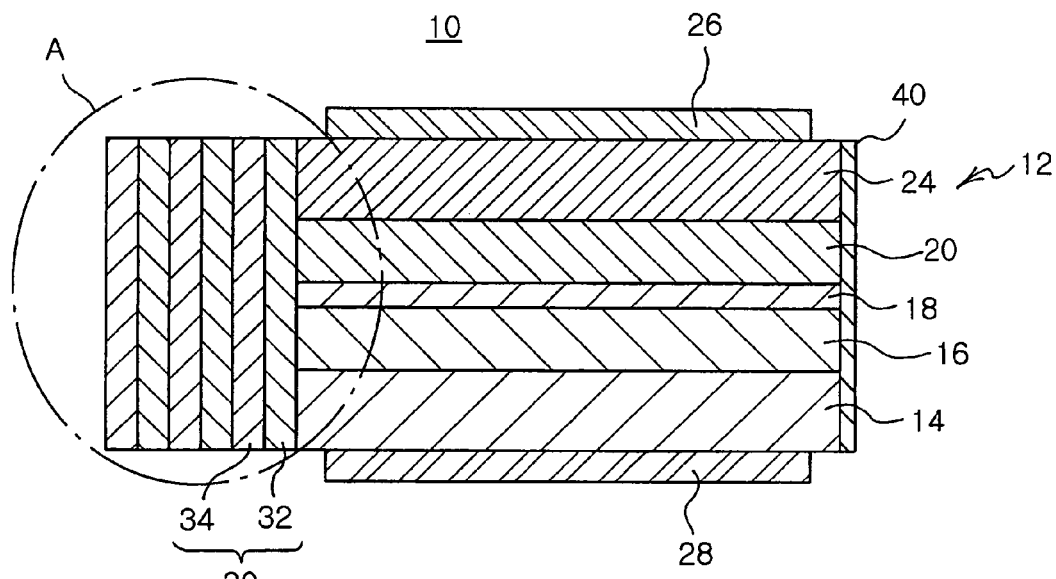
FIG. 3 is another cross-sectional view taken along the line III-III in FIG. 1.
Figure 4:
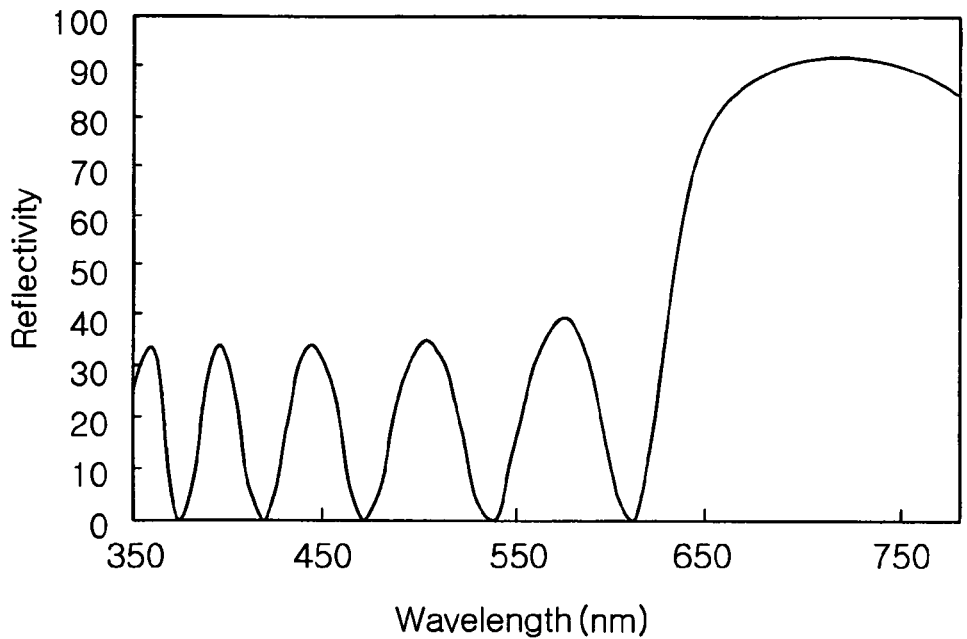
FIGS. 4 and 5 are graphs each illustrating a reflectivity curve of a conventional dielectric reflective layer with respect to wavelengths.
Figure 5:
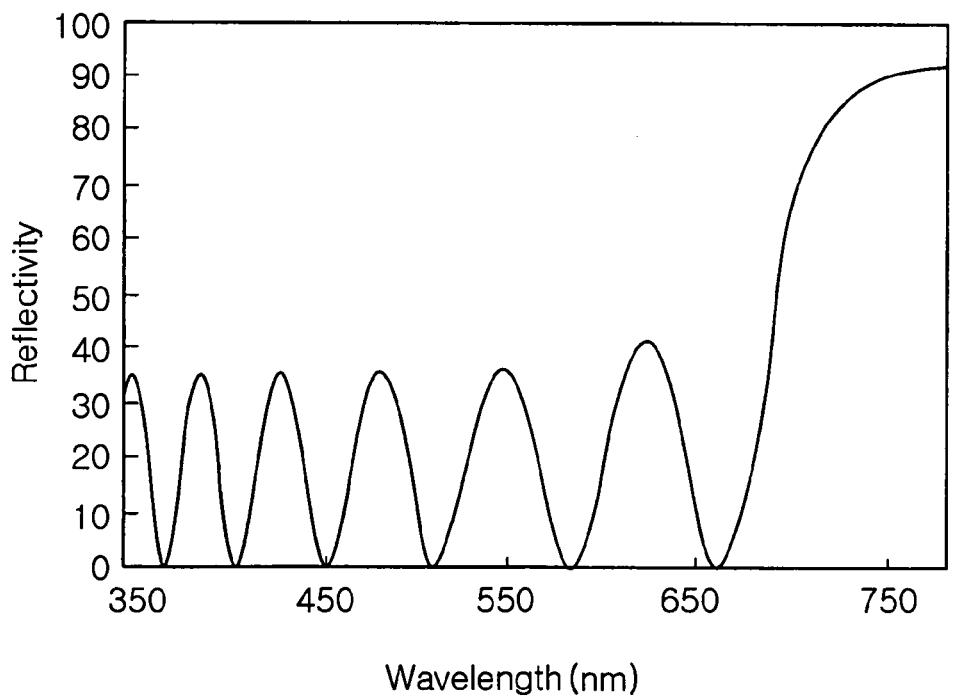
Figure 6:
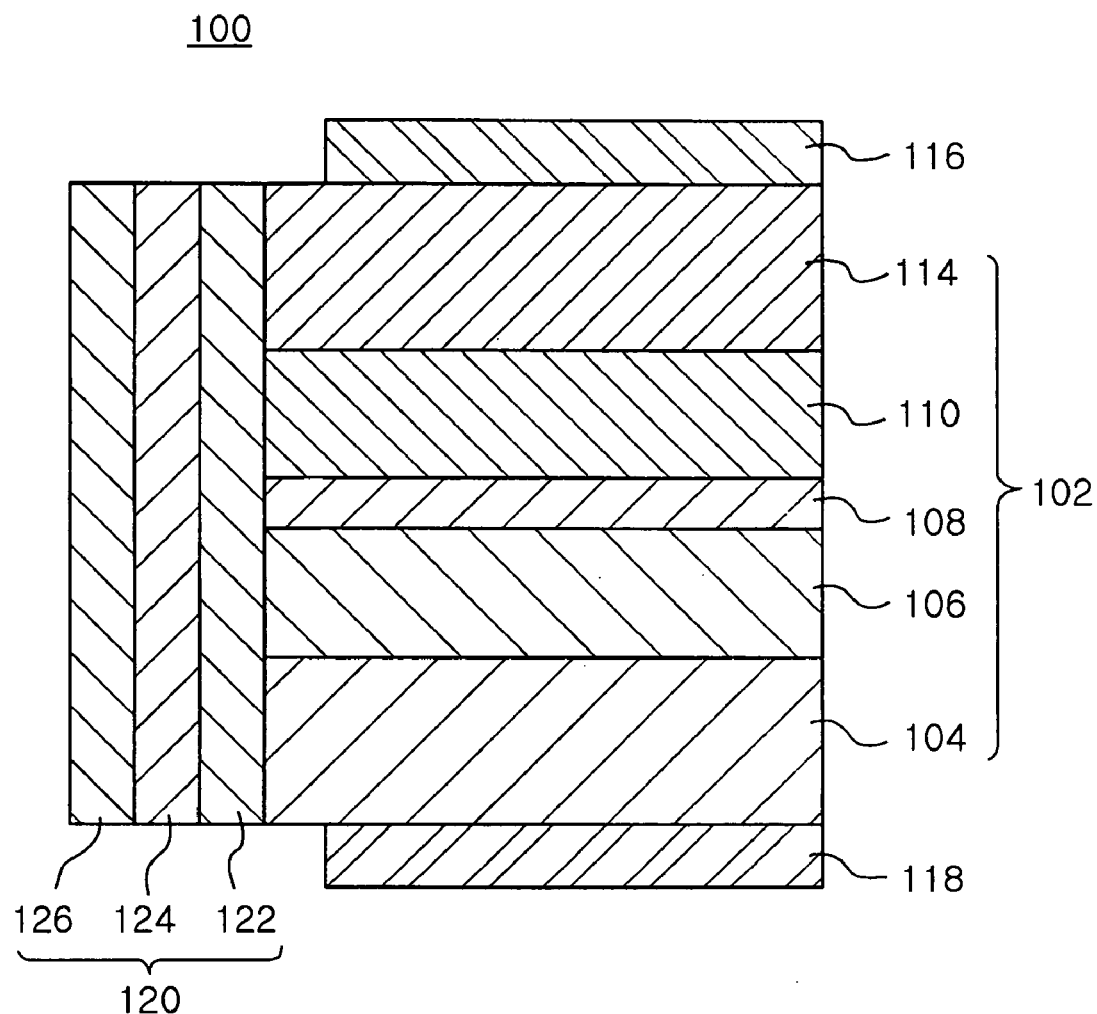
FIG. 6 is a cross-sectional view of a multi-wavelength laser diode according to a first embodiment of the invention.

FIG. 6 is a cross-sectional view of a multi-wavelength laser diode according to a first embodiment of the invention, which shows only a part of the entire laser diode corresponding to the A part in FIG. 3 for the sake of brevity.

Figure 1:
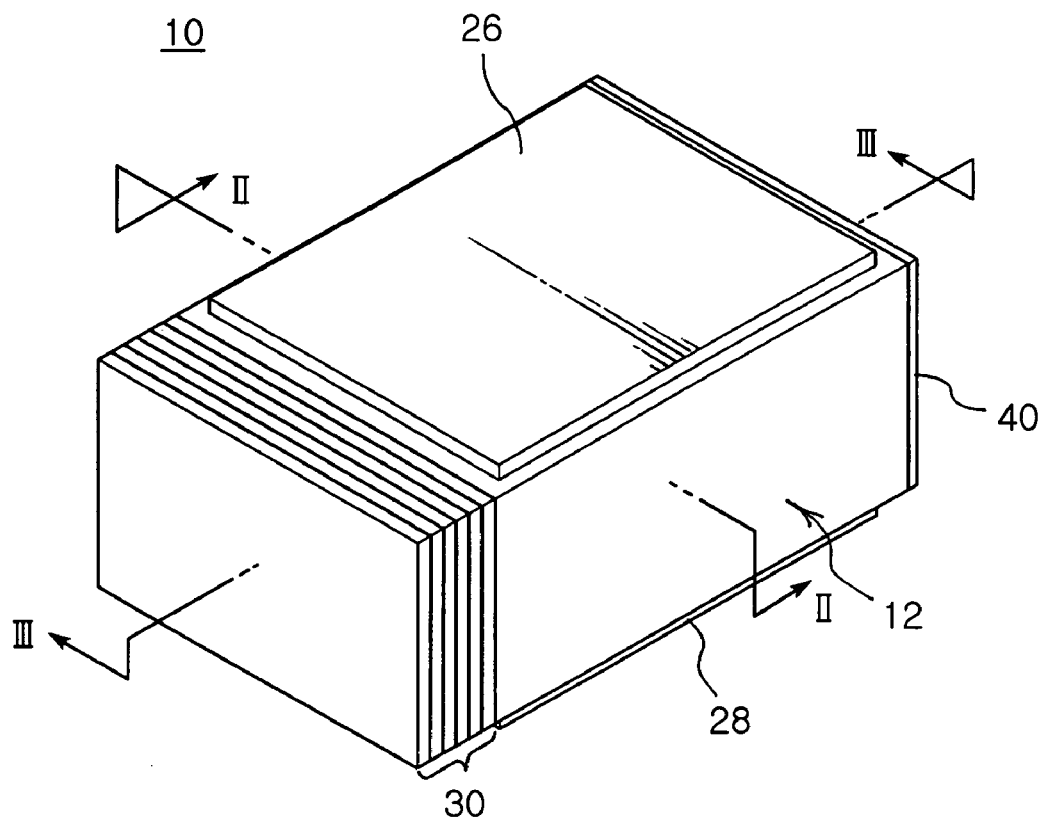
FIG. 1 is a perspective view of a conventional laser diode.
Figure 2:
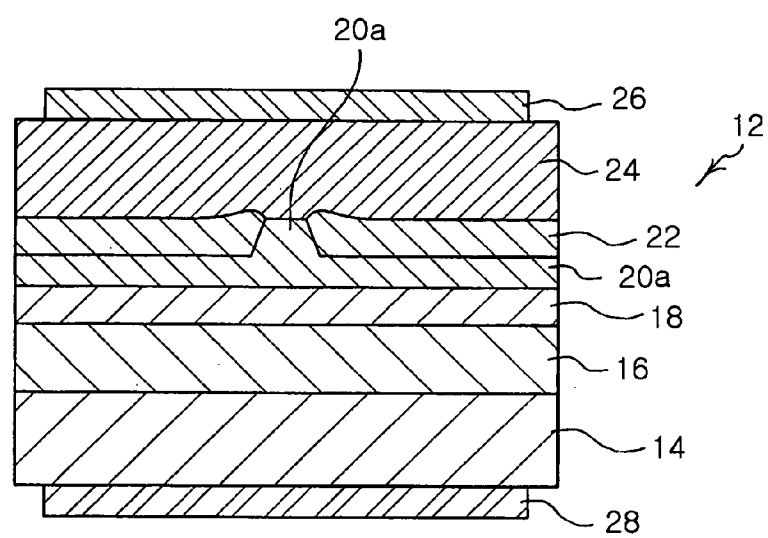
FIG. 2 is a cross-sectional view taken along the line II-II in FIG. 1.

Referring to FIG. 6, a multi-wavelength laser diode 100 according to the first embodiment of the invention has an oscillating structure 102 which includes an n-doped or lower cladding layer 106, an active layer 108, a p-doped or upper cladding layer 110 having a ridge (not shown, cf. the ridge 20a in FIG. 2), inactive regions (not shown, cf. the inactive regions 22 in FIG. 2) such as current blocking layers formed at both sides of the ridge and a capping layer 114 which are formed in their order on a semiconductor substrate 104.

P- and n-metal layers 116 and 118 are formed on the top and the underside of the oscillating structure 102, respectively, a reflective layer 120 is formed on one face of the oscillating structure 102 including one longitudinal end of the ridge (not shown), and an anti-reflective layer (not shown) is formed on the other side of the oscillating structure opposite to the reflecting layer 120.

The reflective layer 120 includes a dielectric layer 122, a first metal layer 124 and a second metal layer 126. The dielectric layer 122 of a thin film is formed via deposition of dielectric material such as $Al_2O_3$, $Si_3N_4$ and $SiO_2$. The dielectric layer 122 electrically insulates the p- and n-metal layers 116 and 118 from the reflective metal layers 124 and 126. Of course, if the electrical insulation can be achieved between the p- and n-metal layers 116 and 118 and the reflective metal layers 124 and 126 through suitable modification of the process, the dielectric layer 122 may be omitted.

The first metal layer 124 is designed to achieve a high reflectivity of preferably at least 95% in a high wavelength range (e.g., at least 400 nm), and made of at least one metal selected from the group consisting of Ag, Au, Cu, Pd and Pt. The second metal layer 126 is preferably made of Al to achieve a high reflectivity in a relatively low wavelength range (e.g., under 400 nm).

Figure 7:
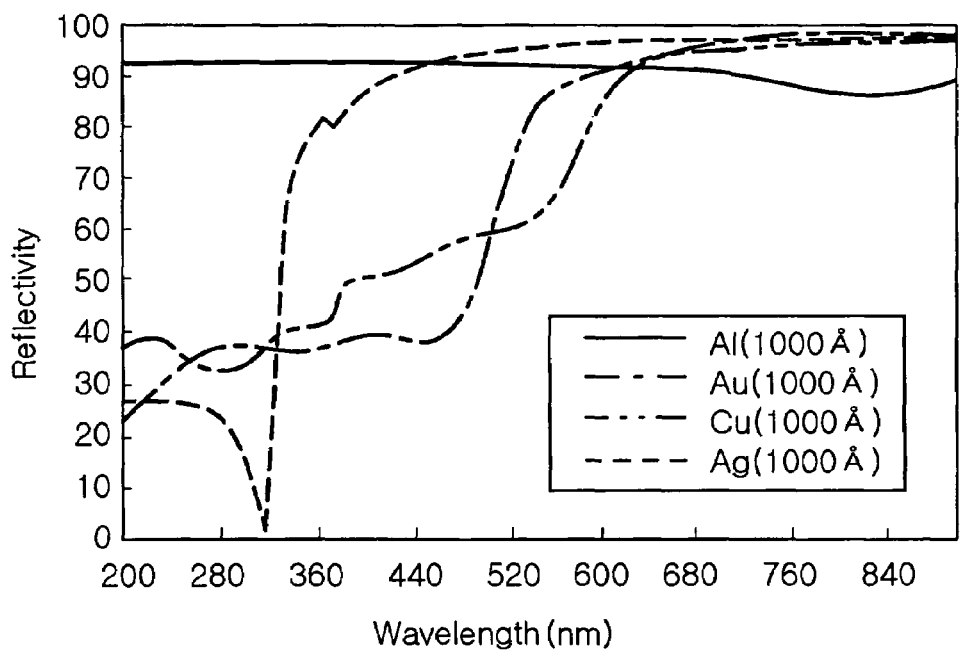
FIG. 7 is a graph illustrating reflectivity curves of various metals with respect to wavelengths.
Figure 8:
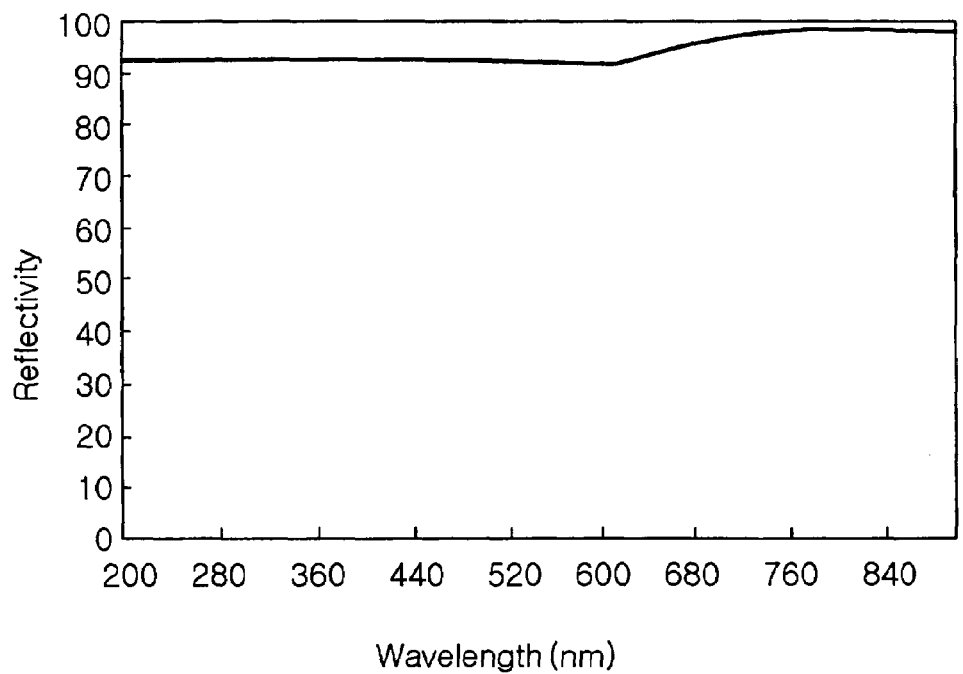
FIG. 8 is a graph illustrating a reflectivity curve of an Au—Al layer with respect to wavelengths according to the first embodiment of the invention.

The present invention will now be described further with reference to FIGS. 7 and 8 together with FIG. 6, in which FIG. 7 is a graph illustrating reflectivity curves of various metals with respect to wavelengths, and FIG. 8 is a graph illustrating a reflectivity curve of an Au—Al layer with respect to wavelengths according to the first embodiment of the invention.

Referring to FIG. 7, Ag, Au and Cu each show a higher reflectivity than Al in a high wavelength range but show a lower reflectivity than Al in a low wavelength range. In addition, while each of Ag, Au and Cu shows abrupt drop in reflectivity at a specific wavelength or less, Al maintains generally high reflectivity of about at least 90% in the low wavelength range also.

Therefore, as shown in FIG. 6, when the reflective layer 120 is formed by selectively coating the dielectric layer 122 on one face of the oscillating structure 102 and coating the first metal layer 124 of Ag, Au or Cu and the second metal layer 126 of Al in their order on the dielectric layer 122, the reflective layer 120 can achieve a high reflectivity of about at least 90% in the entire wavelength range as shown in FIG. 8. In FIG. 8, the first metal layer 124 is made of for example Au having excellent adhesion. Au can be replaced with Ag, Cu, Pd or Pt also. As shown in FIG. 8, the reflectivity curve shows a generally high reflectivity since Au mainly reflects light in the high wavelength range and Al mainly reflects light in the low wavelength range.

In this case, the first and second metal layers 124 and 146 are deposited via sputtering or electron beam deposition.

The sputtering flows sputtering gas into a vacuum chamber to collide it against a target, thereby forming plasma from target material, so that the plasma is coated in the form of a thin film on a substrate. Generally, the sputtering gas utilizes inactive gas such as Ar.

Describing the sputtering process in brief, when a voltage is applied to the target functioning as a cathode and a substrate functioning as an anode, sputtering gas is excited into $Ar^+$ ions through collision with electrons emitted from the anode. Then, the $Ar^+$ ions are attracted toward and collide against the target functioning as the anode. Since the excited $Ar^+$ ions each have a predetermined energy h υ, the energy is delivered to the target during collision. When the energy exceeds the bonding force of a target element and the work function of the electrons, plasma is emitted from the target. The plasma rises up to the extent of the free path of electrons, and when the substrate is spaced from the target within the free path, forms a thin film on the substrate.

A type of the sputtering using a DC voltage is referred to as DC sputtering, and generally used for the deposition of conductors. In case of nonconductors such as insulators, a thin film is formed via AC sputtering using an AC voltage. The AC sputtering is also referred to as Radio Frequency (RF) sputtering since it uses an AC voltage typically having a frequency of 13.56 MHz.

The electron beam deposition uses electron beams to heat a holder in a high vacuum atmosphere (i.e., $5 \times 10^{-5}$ to $1 \times 10^{-7}$ torr). In this fashion, metal on the holder is melted and evaporated so that metal vapors are condensed on the surface of a wafer that is relatively cold. The electron beam deposition is mainly used for the fabrication of a thin film on a semiconductor wafer.

Figure 9:
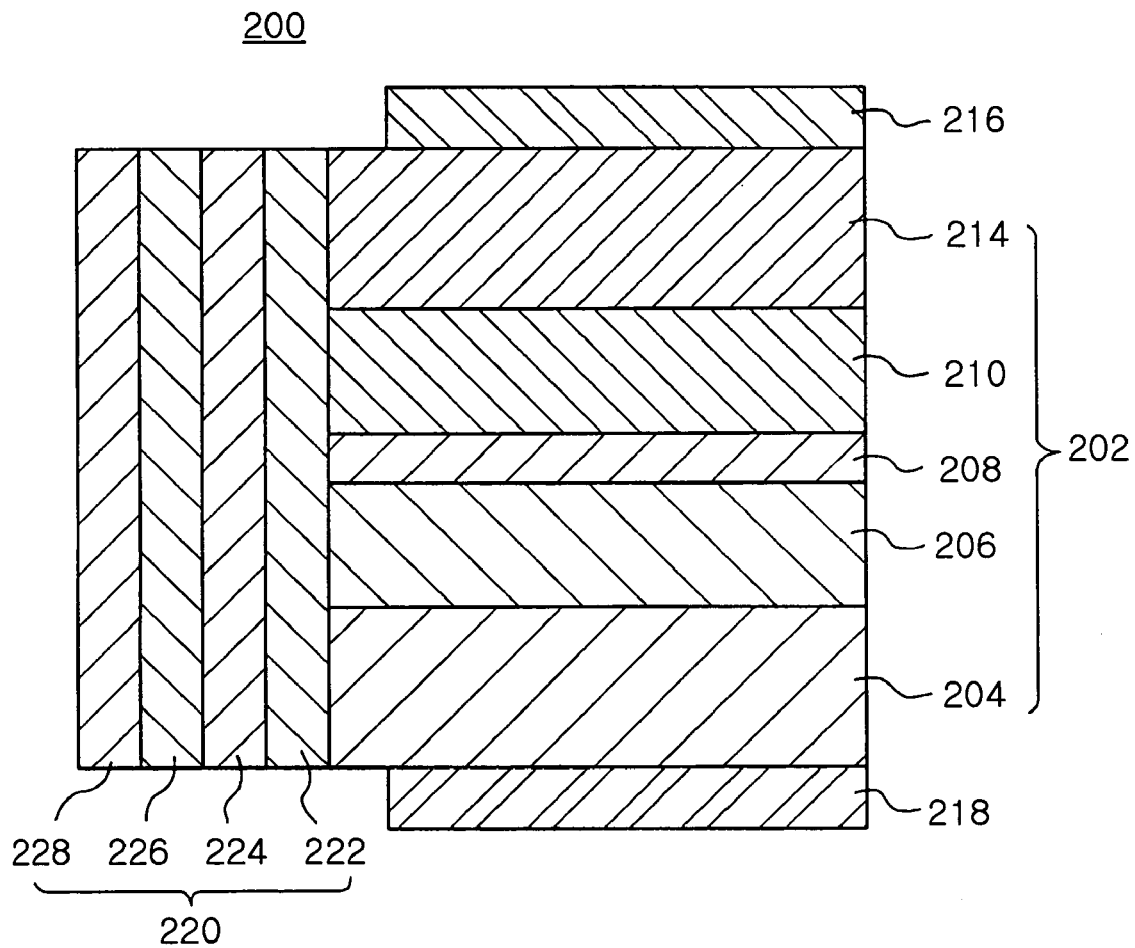
FIG. 9 is a cross-sectional view of an alternative to the multi-wavelength laser diode shown in FIG. 6.

FIG. 9 is a cross-sectional view of an alternative to the multi-wavelength laser diode shown in FIG. 6. As shown in FIG. 9, a multi-wavelength laser diode 200 has a structure substantially the same as that of the multi-wavelength laser diode 100 shown in FIG. 6 except that a dielectric reflective layer 228 having at least a pair of $Al_2O_3$ and $Si_3N_4$ layers that is further deposited on the second metal layer 226.

In the dielectric reflective layer 228, the $Al_2O_3$ and $Si_3N_4$ layers each have at a thickness that is determined by λ/4n as described above in the specification, and thus can have a high reflectivity of at least 95% at a specific wavelength λ. As a result, the dielectric reflective layer 228 can enhance the reflectivity of the second metal layer 226 of Al.

Figure 10:
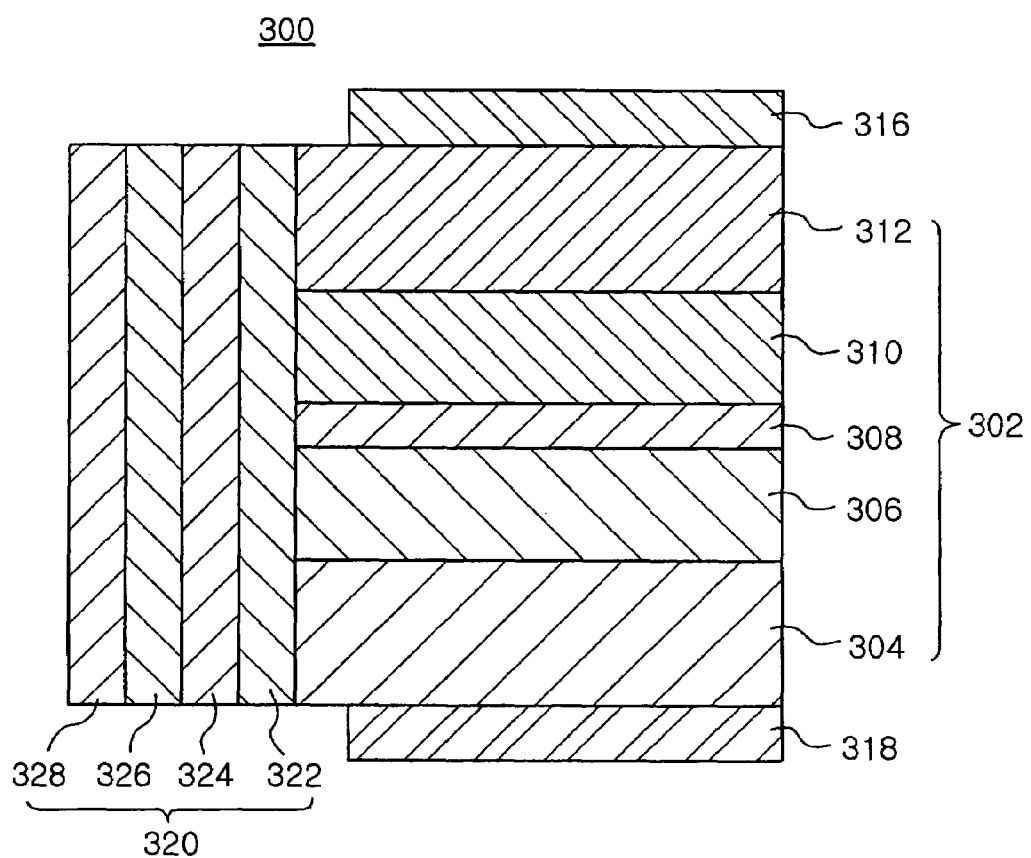
FIG. 10 is a cross-sectional view of a multi-wavelength laser diode according to a second embodiment of the invention.

FIG. 10 is a cross-sectional view of a multi-wavelength laser diode according to a second embodiment of the invention.

Referring to FIG. 10, a multi-wavelength laser diode 300 according to the second embodiment of the invention has an oscillating structure 302 which includes, an n-doped or lower cladding layer 306, an active layer 308, a p-doped or upper cladding layer 310 having a ridge (not shown, cf. the ridge 20a in FIG. 2), inactive regions (not shown, cf. the inactive regions 22 in FIG. 2) such as current blocking layers formed at both sides of the ridge and a capping layer 314 which are formed in their order on a semiconductor substrate 304.

P- and n-metal layers 316 and 318 are formed on the top and the underside of the oscillating structure 302, respectively, a reflective layer 320 is formed on one face of the oscillating structure 302 including one longitudinal end of the ridge (not shown), and an anti-reflective layer (not shown) is formed on the other side of the oscillating structure opposite to the reflecting layer 320.

The reflective layer 320 includes a dielectric layer 322, a first metal layer 324, a second metal layer 326 and a third metal layer 328. The dielectric layer 322 of a thin film is formed via deposition of dielectric material such as $Al_2O_3$, $Si_3N_4$ and $SiO_2$. The dielectric layer 322 electrically insulates the p-and n-metal layers 316 and 318 from the reflective metal layers 324, 326 and 328. Of course, if the electrical insulation can be achieved between the p- and n-metal layers 316 and 318 and the reflective metal layers 324, 326 and 328 through suitable modification of the process, the dielectric layer 322 may be omitted.

The first metal layer 324 is designed to achieve a high reflectivity of preferably at least 95% in a high wavelength range, e.g., at least 600 nm, and made of at least one metal selected from the group consisting of Ag, Au, Cu, Pd and Pt. The first metal layer 324 is preferably made of Au in view of adhesion. The second metal layer 326 is designed to maintain a high reflectivity in an intermediate wavelength range of 400 to 600 nm, and preferably made of Ag. The third metal layer 328 is preferably made of Al to achieve a high reflectivity in a relatively low wavelength range for example under 400 nm.

The multi-wavelength laser diode 300 according to the second embodiment of the invention will be described further with reference to FIG. 11 together with FIG. 10 above.

Figure 11:
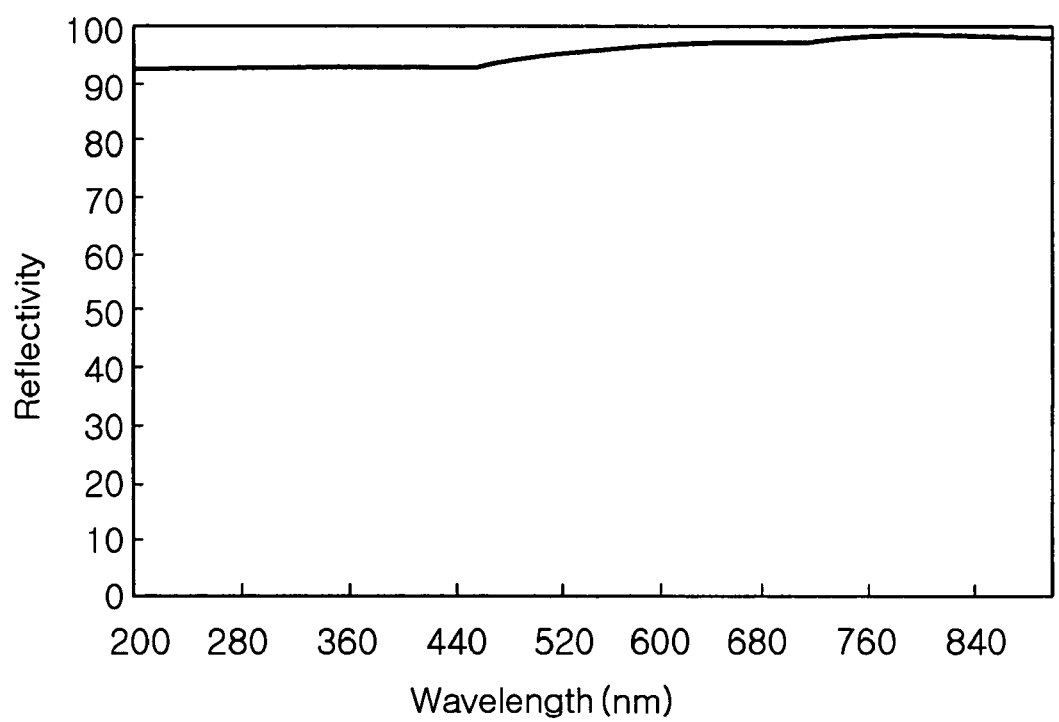
FIG. 11 is a graph illustrating a reflectivity curve of an Au—Ag—Al layer with respect to wavelengths according to the second embodiment of the invention.

FIG. 11 is a graph illustrating a reflectivity curve of an Au—Ag—Al layer with respect to wavelengths according to the second embodiment of the invention. Since the reflective layer 320 has the dielectric layer 322, the first metal layer of Au, the second metal layer 326 of Ag and the third metal layer 326 of Al, light of a high wavelength is mainly reflected by Au, light of an intermediate wavelength is mainly reflected by Ag and light of a low wavelength is reflected by Al so that the reflective metal layer 326 can achieve a high reflectivity in the entire wavelength range as seen in FIG. 11.

The first to third metal layers 224, 226 and 228 are deposited via sputtering or electron beam deposition.

In the multi-wavelength laser diode 300 according to the second embodiment of the invention, at least a pair of $Al_2O_3$ and $Si_3N_4$ layers may be further deposited on the second metal layer 226 thereby forming a dielectric reflective layer thereon. In the dielectric reflective layer, the $Al_2O_3$ and $Si_3N_4$ layers each have at a thickness that is determined by $\lambda/4n$ as described above in the specification, and thus can have a high reflectivity of at least 95% at a specific wavelength $\lambda$. As a result, the dielectric reflective layer can enhance the reflectivity of the third metal layer 328 of Al.

Figure 12:
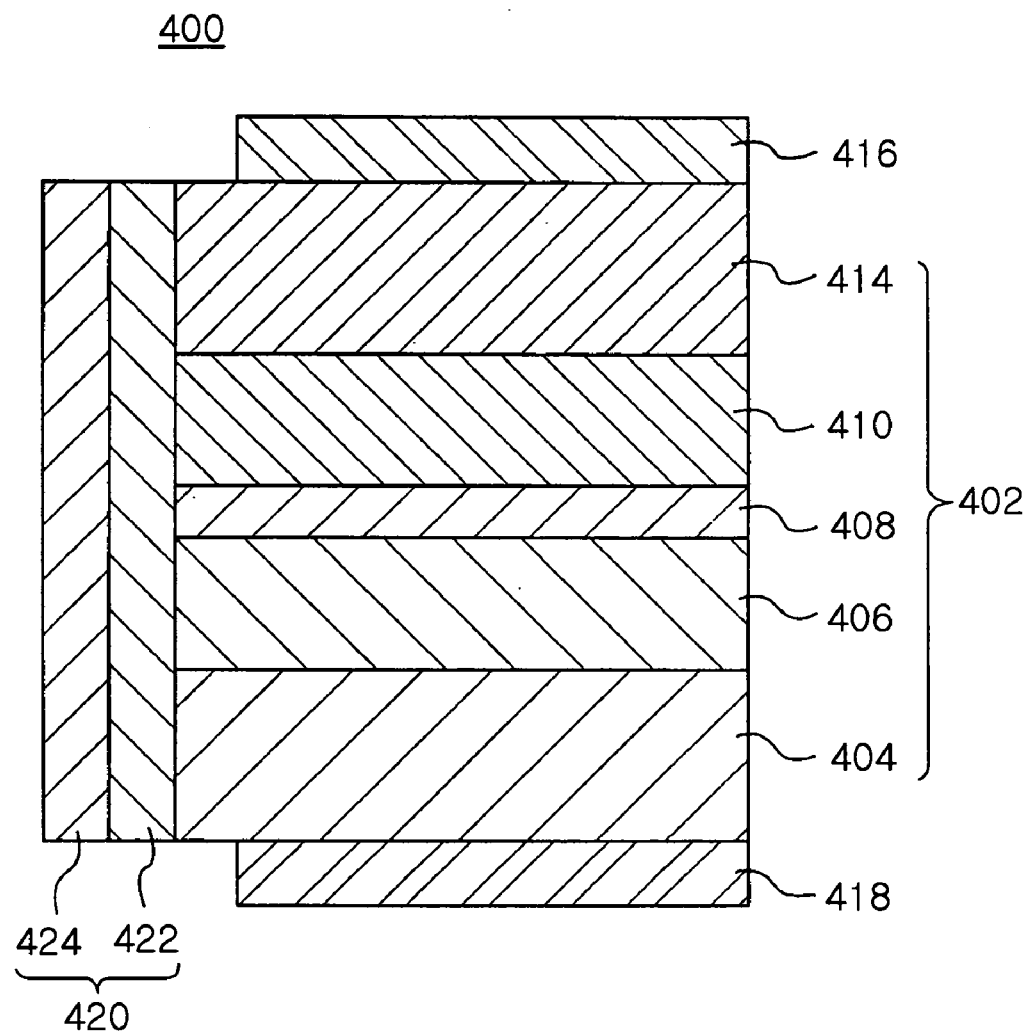
FIG. 12 is a cross-sectional view of a multi-wavelength laser diode according to a third embodiment of the invention.

FIG. 12 is a cross-sectional view of a multi-wavelength laser diode according to a third embodiment of the invention.

Referring to FIG. 12, a multi-wavelength laser diode 400 according to the third embodiment of the invention has an oscillating structure 402 which includes an n-doped or lower cladding layer 406, an active layer 408, a p-doped or upper cladding layer 410 having a ridge (not shown, cf. the ridge 20a in FIG. 2), inactive regions (not shown, cf. the inactive regions 22 in FIG. 2) such as current blocking layers formed at both sides of the ridge and a capping layer 414 which are formed in their order on a semiconductor substrate 404.

P- and n-metal layers 416 and 418 are formed on the top and the underside of the oscillating structure 402, respectively, a reflective layer 420 is formed on one face of the oscillating structure 402 including one longitudinal end of the ridge (not shown), and an anti-reflective layer (not shown) is formed on the other side of the oscillating structure opposite to the reflecting layer 420.

The reflective layer 420 includes a dielectric layer 422 and high reflectivity metal layer 424. The dielectric layer 422 of a thin film is formed via deposition of dielectric material such as $Al_2O_3$, $Si_3N_4$ and $SiO_2$. The dielectric layer 422 electrically insulates the p- and n-metal layers 416 and 418 from the high reflectivity metal layer 424. Of course, if the electrical insulation can be achieved between the p- and n-metal layers 416 and 418 and the high reflectivity metal layer 424 through suitable modification of the process, the dielectric layer 422 may be omitted.

The high reflectivity metal layer 424 is designed to achieve a high reflectivity in the entire wavelength range of the multi-wavelength laser diode 400, and made of a mixture of at least one selected from the first metal group consisting of Ag, Au, Cu, Pd and Pt, each of which shows a high reflectivity in a high wavelength range of 400 nm or more, and Al which shows a high reflectivity in a relatively low wavelength range under 400 nm.

The high reflectivity metal layer 424 is formed by simultaneously depositing one of the first metal group and Al on the dielectric layer 422 via co-sputtering or simultaneous electron beam deposition. When for example Au and Al are co-sputtered, Au is predominantly deposited on the dielectric layer 422 owing to its excellent adhesion thereby forming an Au-rich region in an early stage, and Al is then deposited on the Au-rich region forming an Al-rich region. Herein the terminology "rich region" does not necessarily mean a region of the metal layer 424 where a specific metal is predominant, but means a region of the metal layer 424 where a specific metal is distributed by a relatively larger quantity than in other regions of the metal layer 424.

When the high reflectivity metal layer 424 is formed as above, the Au-rich region shows a high reflectivity in a relatively higher wavelength range whereas the Al-rich region shows a high reflectivity in a relatively lower wavelength range so that the high reflectivity metal layer 424 shows a high reflectivity in the entire wavelength range. The reflectivity of the metal layer 424, when expressed in a graph, can produce a reflectivity curve substantially the same as that in FIG. 8 above.

Figure 13:
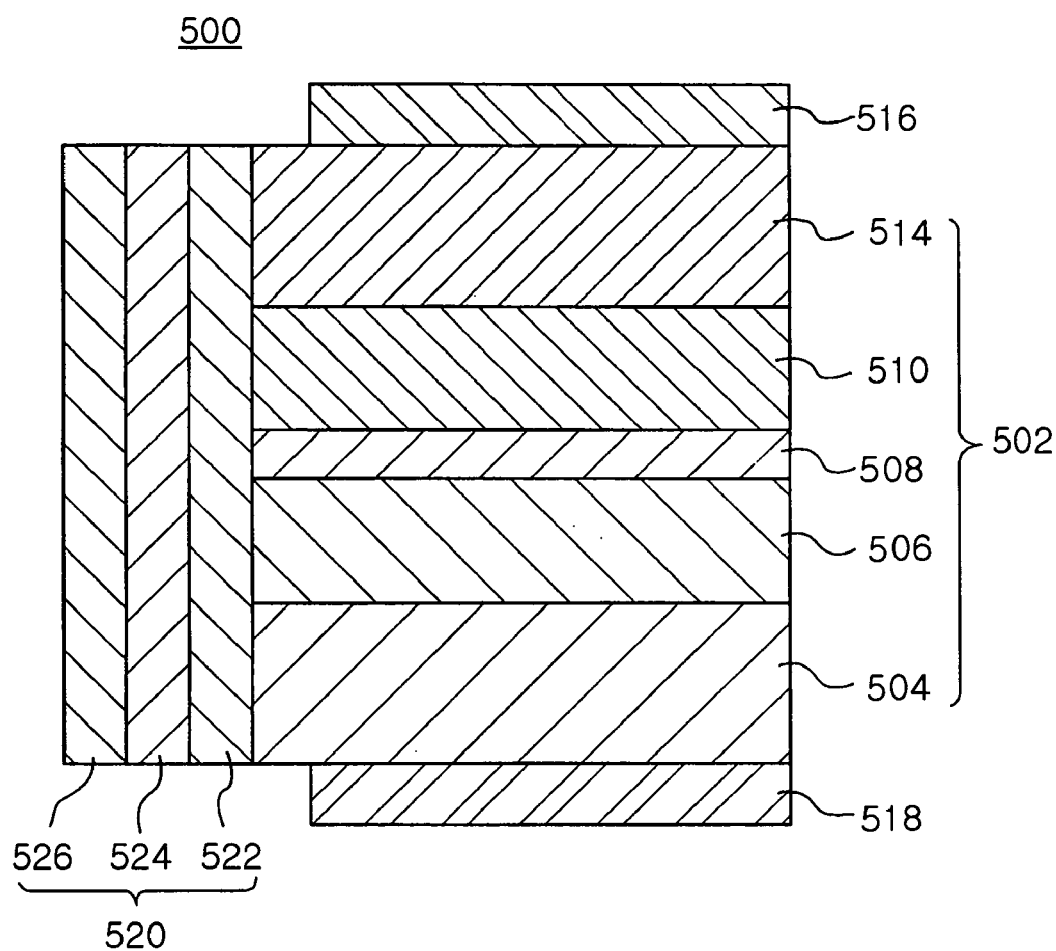
FIG. 13 is a cross-sectional view of an alternative to the multi-wavelength laser diode shown in FIG. 12.

FIG. 13 is a cross-sectional view of an alternative to the multi-wavelength laser diode shown in FIG. 12. As shown in FIG. 13, a multi-wavelength laser diode 500 has a structure substantially the same as that of the multi-wavelength laser diode 400 shown in FIG. 12 except that a dielectric reflective layer 526 having at least a pair of $Al_2O_3$ and $Si_3N_4$ layers is further deposited on the second metal layer 524.

In the dielectric reflective layer 526, the $Al_2O_3$ and $Si_3N_4$ layers each have at a thickness that is determined by $\lambda/4n$ as described above in the specification, and thus can have a high reflectivity of at least 95% at a specific wavelength $\lambda$. As a result, the dielectric reflective layer 228 can enhance the reflectivity of the second metal layer 526 of Al.

Figure 14:
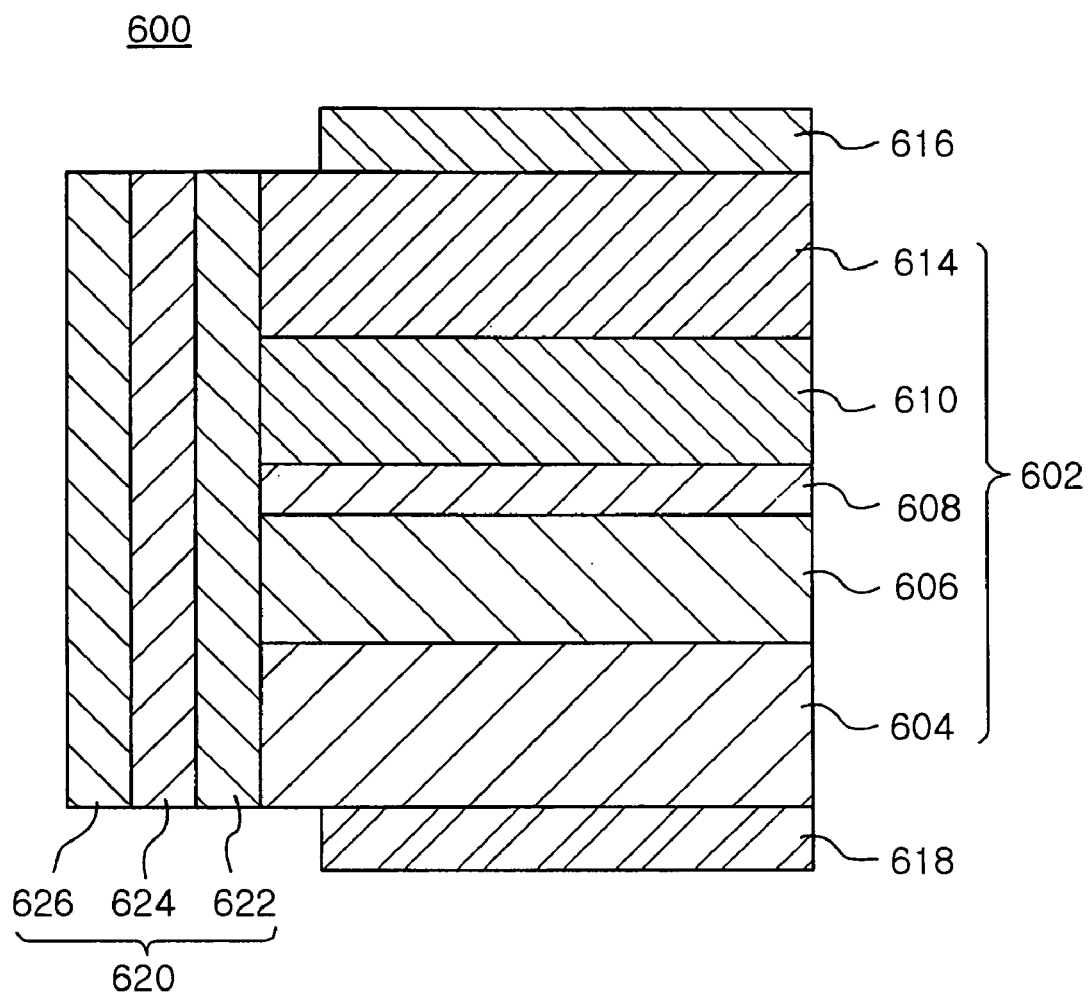
FIG. 14 is a cross-sectional view of a multi-wavelength laser diode according to a fourth embodiment of the invention.

FIG. 14 is a cross-sectional view of a multi-wavelength laser diode according to a fourth embodiment of the invention.

Referring to FIG. 14, a multi-wavelength laser diode 600 according to the fourth embodiment of the invention has an oscillating structure 602 which includes an n-doped or lower cladding layer 606, an active layer 608, a p-doped or upper cladding layer 610 having a ridge (not shown, cf. the ridge 20a in FIG. 2), inactive regions (not shown, cf. the inactive regions 22 in FIG. 2) such as current blocking layers formed at both sides of the ridge and a capping layer 614 which are formed in their order on a semiconductor substrate 604.

P- and n-metal layers 616 and 618 are formed on the top and the underside of the oscillating structure 602, respectively, a reflective layer 620 is formed on one face of the oscillating structure 602 including one longitudinal end of the ridge (not shown), and an anti-reflective layer (not shown) is formed on the other side of the oscillating structure opposite to the reflecting layer 620.

The reflective layer 620 includes a dielectric layer 622 and first and second high reflectivity metal layers 624 and 626. The dielectric layer 622 of a thin film is formed via deposition of dielectric material such as $Al_2O_3$, $Si_3N_4$ and $SiO_2$. The dielectric layer 622 electrically insulates the p- and n-metal layers 616 and 618 from the first and second high reflectivity metal layers 624 and 626. Of course, if the electrical insulation can be achieved between the p- and n-metal layers 616 and 618 and the high reflectivity first and second metal layer 624 and 626 through suitable modification of the process, the dielectric layer 622 may be omitted.

The first high reflectivity metal layer 624 is designed to achieve a high reflectivity in the entire wavelength range of the multi-wavelength laser diode 600, and made of a mixture of at least two selected from the first metal group consisting of Ag, Au, Cu, Pd and Pt, each of which shows a high reflectivity in a high wavelength range of 400 nm or more. Preferably, the high reflectivity metal layer 624 can be made of a mixture of Ag and Au so as to achieve a high reflectivity in a wavelength range of at least 40 n.

The high reflectivity metal layer 624 is formed by simultaneously depositing one of Ag and Au on the dielectric layer 622 via co-sputtering or simultaneous electron beam deposition. When Au and Ag are co-sputtered, Au is predominantly deposited on the dielectric layer 622 owing to its excellent adhesion thereby forming an Au-rich region in an early stage, and Ag is then deposited on the Au-rich region forming an Ag-rich region. Herein the terminology "rich region" does not necessarily mean a region of the metal layer 624 where a specific metal is predominant, but means a region of the metal layer 624 where a specific metal is distributed by a relatively larger quantity than in other regions of the metal layer 624.

When the first high reflectivity metal layer 624 is formed as above, the Au-rich region shows a high reflectivity in a relatively higher wavelength range whereas the Ag-rich region shows a high reflectivity in a relatively intermediate wavelength range so that the high reflectivity metal layer 624 shows a high reflectivity through the intermediate to high wavelength ranges.

On the other hand, the second metal layer 626 formed on the first metal layer 624 is made Al which shows a high reflectivity in a relatively low wavelength range under 400 nm. Accordingly, the second metal layer 626 reflects excellently a portion of light in the low wavelength range which has penetrated the first metal layer 624 so that the reflective layer 620 of the invention can have a high reflectivity in the entire wavelength range.

When expressed in a graph, the reflectivity of the metal layer 624 can produce a reflectivity curve substantially the same as that in FIG. 11 above.

Figure 15:
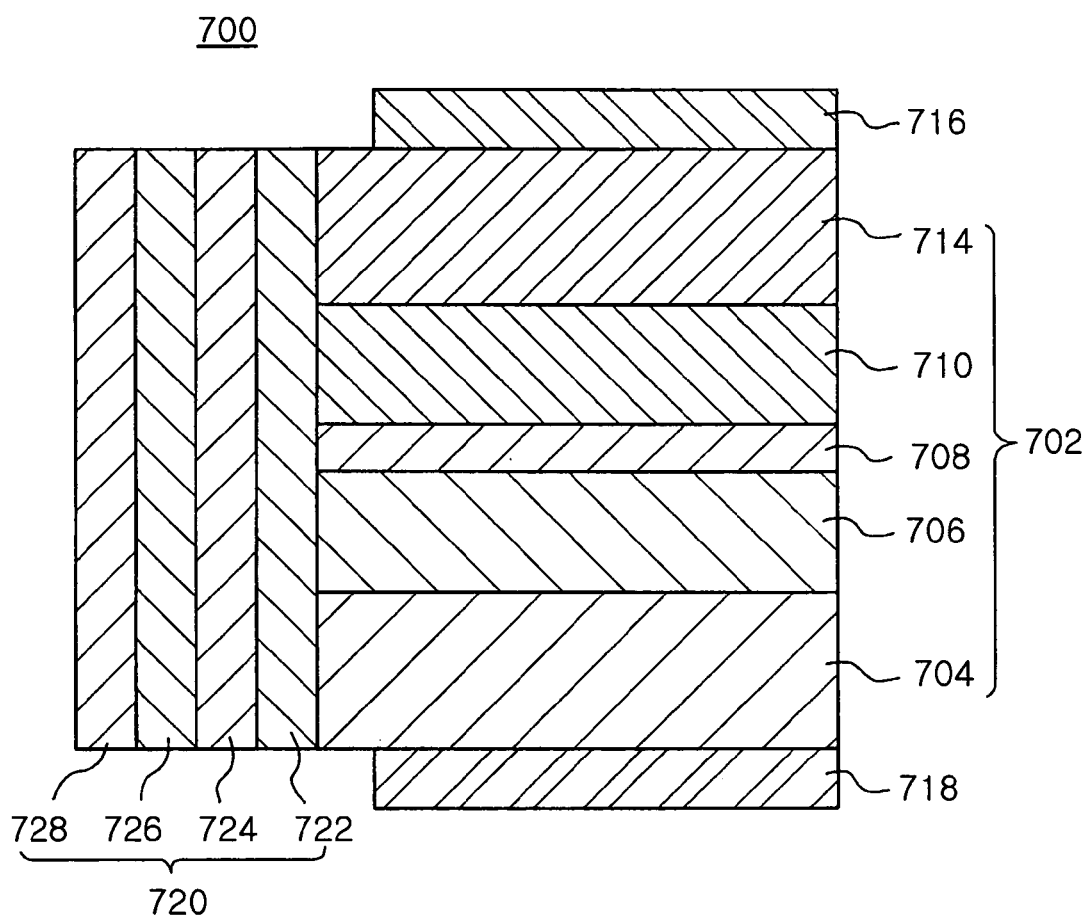
FIG. 15 is a cross-sectional view of an alternative to the multi-wavelength laser diode shown in FIG. 14.

FIG. 15 is a cross-sectional view of an alternative to the multi-wavelength laser diode shown in FIG. 14. Referring to FIG. 15, a multi-wavelength laser diode 700 has a structure substantially the same as that of the multi-wavelength laser diode 600 shown in FIG. 14 except that a dielectric reflective layer 728 having at least a pair of $Al_2O_3$ and $Si_3N_4$ layers is further deposited on the second metal layer 726.

In the dielectric reflective layer 728, the $Al_2O_3$ and $Si_3N_4$ layers each have at a thickness that is determined by $\lambda/4n$ as described above in the specification, and thus can have a high reflectivity of at least 95% at a specific wavelength $\lambda$. As a result, the dielectric reflective layer 728 can enhance the reflectivity of the second metal layer 726 of Al.

According to the present invention as described hereinbefore, the metal reflective layer of the multi-wavelength laser diode can achieve a high reflectivity uniformly in a multi-wavelength in order to lower threshold voltage while securing high output power.

Furthermore, the metal reflective layer of the invention can be fabricated more simply than the conventional dielectric reflective layer so as to enhance the productivity of the multi-wavelength laser diode.

While the present invention has been shown and described in connection with the preferred embodiments, it will be apparent to those skilled in the art that modifications and variations can be made without departing from the spirit and scope of the invention as defined by the appended claims.

What is claimed is:

1. A multi-wavelength laser diode comprising:
   an oscillating structure including a semiconductor substrate, and a lower cladding layer, an active layer and a ridge formed in their order on the semiconductor substrate;
   a first metal layer formed on a first face of the oscillating structure including one end of the ridge, the first metal layer being made of a metal having a high reflectivity in a first wavelength range of at least a predetermined wavelength; and
   a second metal layer formed on the first metal layer, the second metal layer being made of a metal having a high reflectivity in a second wavelength range under the predetermined wavelength.

2. The multi-wavelength laser diode according to claim 1, further comprising a dielectric layer interposed between the first metal layer and the first face of the oscillating structure.

3. The multi-wavelength laser diode according to claim 1, wherein the first metal layer is made of at least one selected from the group consisting of Ag, Au, Cu, Pd and Pt.

4. The multi-wavelength laser diode according to claim 1, wherein the second metal layer is made of Al.

5. The multi-wavelength laser diode according to claim 1, further comprising a high reflectivity intermediate metal layer interposed between the first and second metal layers.

6. The multi-wavelength laser diode according to claim 5, wherein the intermediate metal layer is formed via sputtering or electron beam deposition.

7. The multi-wavelength laser diode according to claim 5, wherein the first metal layer is made of Au or Cu, the intermediate metal layer is made of Ag, and the second metal layer is made of Al.

8. The multi-wavelength laser diode according to claim 1, further comprising at least a pair of high and low reflectivity dielectric layers formed on the second metal layer.

9. The multi-wavelength laser diode according to claim 1, wherein the first an A second metal layers are formed via sputtering or electron beam deposition.

10. The multi-wavelength laser diode according to claim 1, further comprising an anti-reflective layer formed on a second face of the oscillating structure opposite to the first face thereof.

11. A multi-wavelength laser diode comprising:
    an oscillating structure including a semiconductor substrate, and a lower cladding layer, an active layer and a ridge formed in their order on the semiconductor substrate; and
    a high reflectivity metal layer formed on a first face of the oscillating structure including one longitudinal end of the ridge, and made of a mixture of at least two high reflectivity metals, whereby a first one of the metals having a high reflectivity in a high wavelength range of at least a predetermined wavelength is rich in a first region of the high reflectivity metal layer thereby to form a high-wavelength reflective region therein, and a second one of the metals having a high reflectivity in a low wavelength range under the predetermined wavelength is rich in a second region of the high reflectivity metal layer thereby to form a low-wavelength reflective region therein.

12. The multi-wavelength laser diode according to claim 11, wherein the first metal is at least one selected from the group consisting of Ag, Au, Cu, Pd and Pt, and the second metal is Al.

13. The multi-wavelength laser diode according to claim 11, further comprising a dielectric layer interposed between the high reflectivity metal layer and the first face of the oscillating structure.

14. The multi-wavelength laser diode according to claim 11, further comprising at least a pair of high and low reflectivity dielectric layers formed on the high reflectivity metal layer.

15. The multi-wavelength laser diode according to claim 11, wherein the high reflectivity metal layer is formed via co-sputtering or simultaneous electron beam deposition of the first and second metals.

16. The multi-wavelength laser diode according to claim 11, further comprising an anti-reflective layer formed on a second face of the oscillating structure opposite to the first face thereof.

17. A multi-wavelength laser diode comprising:
an oscillating structure including a semiconductor substrate, and a lower cladding layer, an active layer and a ridge formed in their order on the semiconductor substrate; and
a first metal layer formed on a first face of the oscillating structure including one longitudinal end of the ridge, and made of a mixture of at least two high reflectivity metals, whereby a first one of the metals having a high reflectivity in a high wavelength range of at least a first wavelength is rich in a first region of the high reflectivity metal layer thereby to form a high-wavelength reflective region therein, and a second one of the metals having a high reflectivity in an wavelength range between the first wavelength and a second wavelength under the first wavelength is rich in a second region of the high reflectivity metal layer thereby to form an intermediate-wavelength reflective region therein; and
a second metal layer formed on the first metal layer, and made of a metal having a high reflectivity in a low wavelength range under the second wavelength.

18. The multi-wavelength laser diode according to claim 17, wherein the first metal is at least one selected from the group consisting of Au, Cu, Pd and Pt, and the second metal is Ag, and the third metal is made of Al.

19. The multi-wavelength laser diode according to claim 17, further comprising a dielectric layer interposed between the first metal layer and the first face of the oscillating structure.

20. The multi-wavelength laser diode according to claim 17, further comprising at least a pair of high and low reflectivity dielectric layers formed on the second metal layer.

21. The multi-wavelength laser diode according to claim 17, wherein the first metal layer is formed via co-sputtering or simultaneous electron beam deposition of the first and second metals.

22. The multi-wavelength laser diode according to claim 17, further comprising an anti-reflective layer formed on a second face of the oscillating structure opposite to the first face thereof.

* * * * *